(12) United States Patent
Oh et al.

(10) Patent No.: US 11,688,656 B2
(45) Date of Patent: Jun. 27, 2023

(54) INTERPOSER AND SEMICONDUCTOR PACKAGE INCLUDING THE SAME

(71) Applicant: Samsung Electronics Co., Ltd., Suwon-si (KR)

(72) Inventors: Junyoung Oh, Seoul (KR); Hyunggil Baek, Suwon-si (KR); Seunghwan Kim, Asan-si (KR); Jungjoo Kim, Hwaseong-si (KR); Jongho Park, Cheonan-si (KR); Yongkwan Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/098,748

(22) Filed: Nov. 16, 2020

(65) Prior Publication Data
US 2021/0320042 A1  Oct. 14, 2021

(30) Foreign Application Priority Data

Apr. 13, 2020 (KR) .................. 10-2020-0044782

(51) Int. Cl.
| | | |
|---|---|---|
| *H01L 23/16* | (2006.01) | |
| *H01L 25/065* | (2023.01) | |
| *H01L 23/498* | (2006.01) | |
| *H01L 23/31* | (2006.01) | |
| *H01L 23/538* | (2006.01) | |

(52) U.S. Cl.
CPC .......... *H01L 23/16* (2013.01); *H01L 23/3128* (2013.01); *H01L 23/49811* (2013.01); *H01L 23/5389* (2013.01); *H01L 25/0657* (2013.01)

(58) Field of Classification Search
CPC .......... H01L 23/3128; H01L 23/49811; H01L 23/5389
See application file for complete search history.

(56) References Cited

U.S. PATENT DOCUMENTS

| | | |
|---|---|---|
| 8,476,115 B2 | 7/2013 | Choi et al. |
| 8,877,567 B2 | 11/2014 | Lee et al. |
| 8,994,176 B2 | 3/2015 | Wu et al. |
| 9,922,924 B1 * | 3/2018 | Shih .................. H01L 23/49811 |
| 9,966,321 B2 | 5/2018 | Lu et al. |

(Continued)

FOREIGN PATENT DOCUMENTS

| | | |
|---|---|---|
| KR | 10-2013-0076899 A | 7/2013 |
| KR | 10-1452857 | 10/2014 |

*Primary Examiner* — Trang Q Tran
(74) *Attorney, Agent, or Firm* — Harness, Dickey & Pierce, P.L.C.

(57) ABSTRACT

A semiconductor package is provided. The semiconductor package includes: a first package substrate; a first semiconductor chip on the first package substrate; an interposer substrate including a lower surface facing the first package substrate, an upper surface opposite to the lower surface, and an upper conductive pad in the upper surface of the interposer substrate; a first dam structure on the upper surface of the interposer substrate and extending along an edge of the upper conductive pad; a first molding layer in contact with the lower and upper surfaces of the interposer substrate and with an outer wall of the first dam structure; and a conductive connector in contact with an inner wall of the at least one first dam structure and with the upper conductive pad.

15 Claims, 13 Drawing Sheets

(56) References Cited

U.S. PATENT DOCUMENTS

| | | |
|---|---|---|
| 10,043,789 B2 | 8/2018 | Kim |
| 10,269,693 B2 | 4/2019 | Chen |
| 10,319,655 B2 | 6/2019 | Yu et al. |
| 2012/0159118 A1 | 6/2012 | Wong et al. |
| 2016/0079163 A1* | 3/2016 | Park .................. H01L 23/49811 257/774 |
| 2018/0082933 A1* | 3/2018 | Ko ........................ H01L 21/568 |
| 2019/0131284 A1* | 5/2019 | Jeng .................. H01L 23/49838 |
| 2019/0393138 A1* | 12/2019 | Milo .................... H01L 21/4842 |
| 2020/0027837 A1* | 1/2020 | Jeng .................... H01L 23/5385 |
| 2020/0365478 A1* | 11/2020 | Lu ........................ H01L 25/162 |
| 2021/0043527 A1* | 2/2021 | Hsieh .................... H01L 21/561 |

* cited by examiner

INTERPOSER AND SEMICONDUCTOR PACKAGE INCLUDING THE SAME

CROSS-REFERENCE TO RELATED APPLICATION

This application claims the benefit of Korean Patent Application No. 10-2020-0044782, filed on Apr. 13, 2020, in the Korean Intellectual Property Office, the disclosure of which is incorporated herein in its entirety by reference.

BACKGROUND

The inventive concepts relate to an interposer and a semiconductor package including the interposer.

In response to the rapid development of the electronics industry and requests of users, electronic devices are further miniaturized, multi-functionalized, and have a large capacity. Accordingly, there is a demand for a semiconductor package including a plurality of semiconductor chips. Due to the growing demand for higher integration of the plurality of semiconductor chips included in a semiconductor package, there frequently occurs a case wherein a printed circuit board cannot accommodate the high integration. To solve this, a semiconductor package connecting among a plurality of semiconductor chips by using an interposer has been developed.

SUMMARY

The inventive concepts provide an interposer and a semiconductor package including the interposer.

According to an aspect of the inventive concepts, there is provided a semiconductor package including: a first package substrate; a first semiconductor chip on the first package substrate; an interposer substrate including a lower surface facing the first package substrate, an upper surface opposite to the lower surface, and an upper conductive pad in the upper surface; a first dam structure on the upper surface of the interposer substrate and extending along an edge of the upper conductive pad; a first molding layer in contact with the lower and upper surfaces of the interposer substrate and with an outer wall of the first dam structure; and a conductive connector in contact with an inner wall of the first dam structure and with the upper conductive pad.

According to another aspect of the inventive concepts, there is provided a semiconductor package including: a first package substrate; a first semiconductor chip on the first package substrate; an interposer substrate including a lower surface facing the first package substrate, an upper surface opposite to the lower surface, and a lower conductive pad in the lower surface and an upper conductive pad in the upper surface; a first conductive connector between the lower conductive pad and the first package substrate; a first dam structure on the upper surface of the interposer substrate and having a ring shape continuously extending along an edge of the upper conductive pad; and a first molding layer in contact with the lower and upper surfaces of the interposer substrate and with an outer wall of the first dam structure, the first molding layer having a height less than or equal to a height of the first dam structure.

According to another aspect of the inventive concepts, there is provided an interposer for a semiconductor package, the interposer including: an interposer substrate; a conductive pad in a surface of the interposer substrate; and a dam structure on the interposer substrate, the dam structure having a ring shape continuously extending along an edge of the conductive pad and including an opening through which the conductive pad is exposed.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
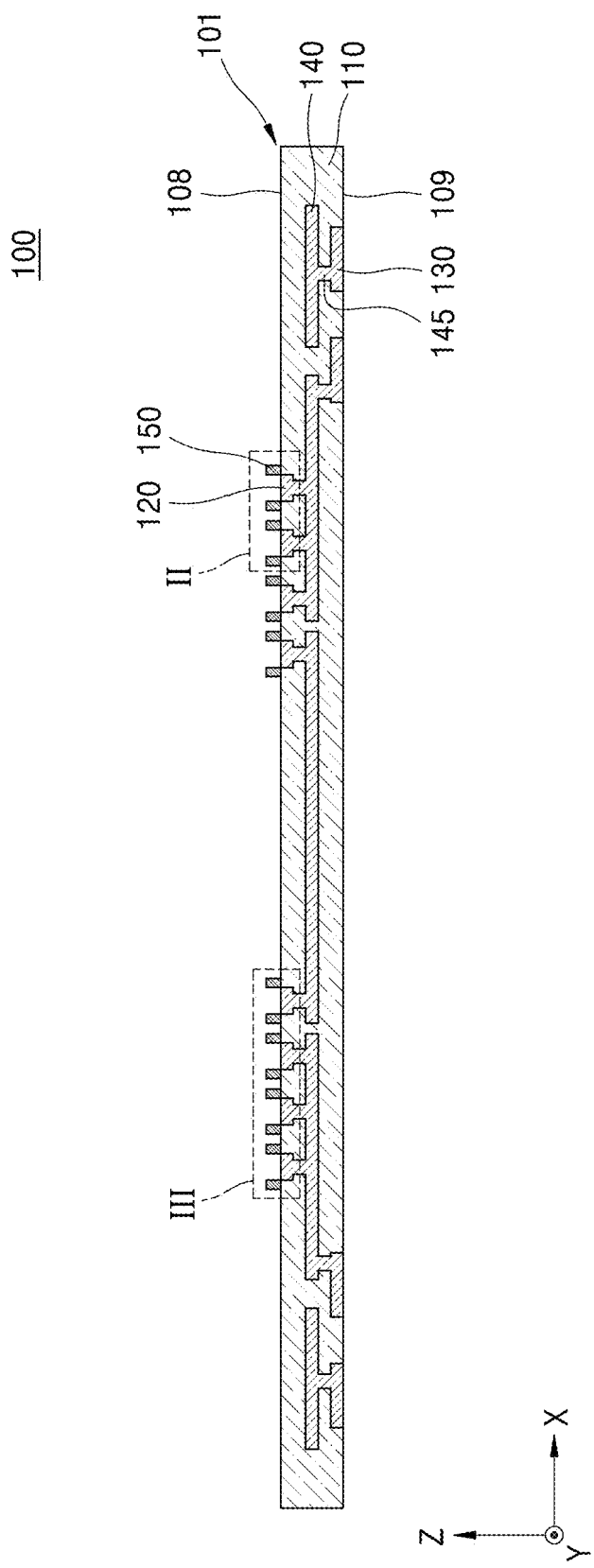
FIG. 1 is a cross-sectional view of an interposer according to some example embodiments of the inventive concepts.

Hereinafter, example embodiments of the inventive concepts will be described in detail with reference to the accompanying drawings Like reference numerals in the drawings denote like elements, and thus their repetitive description will be omitted.

Spatially relative terms, such as "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" other elements or features would then be oriented "above" the other elements or features. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

When the terms "about" or "generally" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about," "substantially," and/or "generally," it will be understood that these values and shapes should be construed as including a manufacturing or operational tolerance (e.g., ±10%) around the stated numerical values and/or shapes.

Figure 2:
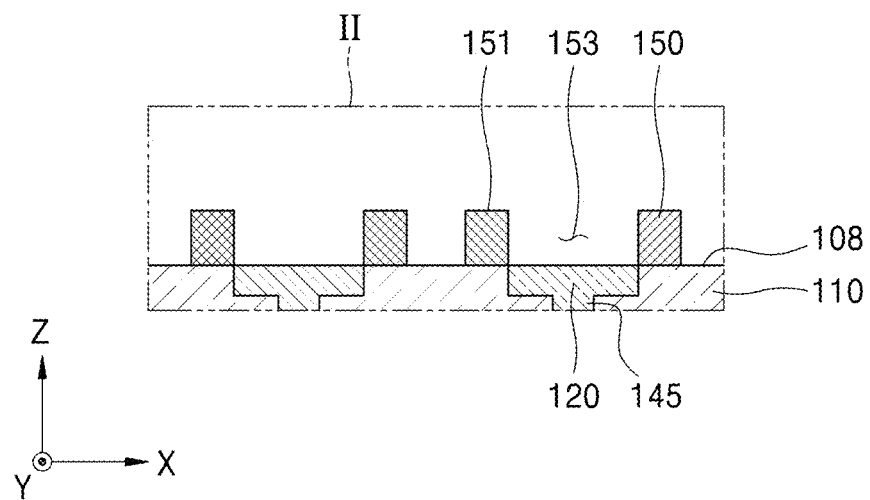
FIG. 2 is an enlarged view of region II of FIG. 1.
Figure 3:
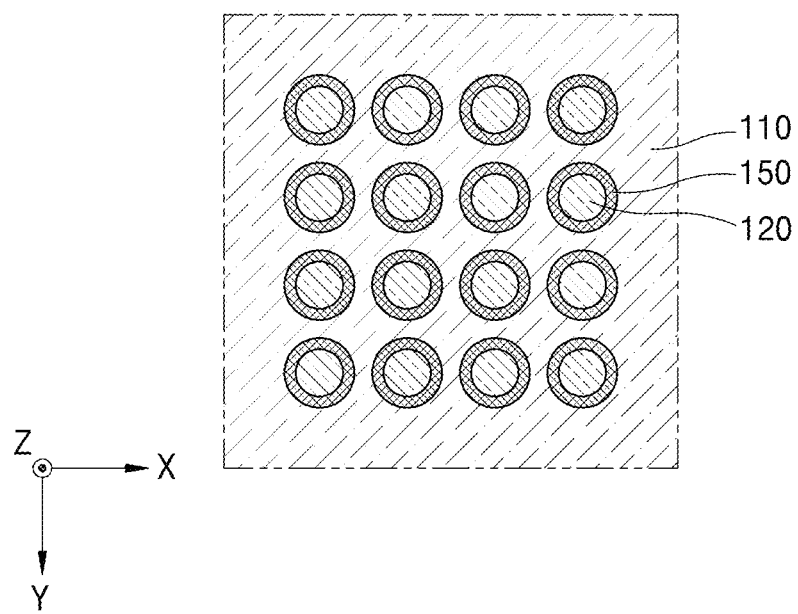
FIG. 3 is a top view of a part of the interposer shown in FIG. 1.

FIG. 1 is a cross-sectional view of an interposer 100 according to some example embodiments of the inventive concepts. FIG. 2 is an enlarged view of region II of FIG. 1. FIG. 3 is a top view of region III of FIG. 1.

Referring to FIGS. 1 to 3, the interposer 100 may include an interposer substrate 101. The interposer substrate 101 may generally have a flat plate shape and include an upper surface 108 and a lower surface 109 opposite to each other. The interposer substrate 101 may include an interposer substrate base 110, an upper conductive pad 120, and a lower conductive pad 130.

For example, the interposer substrate base 110 may be formed of pre-impregnated material ("prepreg"). The prepreg may be, for example, a material formed by mixing glass fibers and/or carbon fibers with a resin (e.g., a pressure-curing, thermoset, and/or photoset polymer). Alternatively, the interposer substrate 101 may be a wafer including a semiconductor, like silicon (Si). In the case where the interposer substrate 101 includes a semiconductor, the semiconductor may be crystalline, polycrystalline, and/or amorphous. For example, the substrate 101 may include crystalline Si, polycrystalline Si, and/or amorphous Si. The interposer substrate 101 may include ceramic, for example an oxide, a nitride, a carbide an oxynitride, and/or a combination thereof. The interposer substrate 101 may be configured to act like an insulator and to electrically separate neighboring upper conductive pads 120.

The upper conductive pad 120 and the lower conductive pad 130 may be on and under the interposer substrate 101, respectively. For example, the upper conductive pad 120 may be embedded in an upper surface 108 of the interposer substrate 101, and the lower conductive pad 130 may be embedded in a lower surface 109 of the interposer substrate 101. The upper conductive pad 120 and the lower conductive pad 130 may be electrically connected to each other via an internal interconnect layer 140 inside the interposer substrate 101. The internal interconnect layer 140 may be, for example, electrically connected to the upper conductive pad 120 and the lower conductive pad 130 by conductive via structures 145.

The upper conductive pad 120 may be a pad to which a conductive connector (e.g., 260 of FIG. 15) may be attached. The lower conductive pad 130 may be a pad to which a board-interposer conductive pad (220 of FIG. 5) for electrically connecting the interposer 100 to a first package substrate (210 of FIG. 5) may be attached.

The upper conductive pad 120 and the lower conductive pad 130 may include a conductive material. For example, the upper conductive pad 120 and the lower conductive pad 130 may include a metal (e.g., copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), and/or an alloy thereof) but is not limited thereto.

The interposer 100 may include a first dam structure 150 on the upper surface 108 of the interposer substrate 101. The first dam structure 150 may be disposed around the upper conductive pad 120 and extend along an edge of the upper conductive pad 120. For example, the first dam structure 150 may encircle an outer edge of the upper conductive pad 120. The first dam structure 150 may be spaced outward from the upper conductive pad 120 and/or at least partially come in contact with the upper conductive pad 120. The first dam structure 150 may protrude upward from the upper surface 108 of the interposer substrate 101. A level of an upper surface 151 of the first dam structure 150 may be higher than a level of an upper surface of the upper conductive pad 120.

The first dam structure 150 may have a ring shape continuously extending along the edge of the upper conductive pad 120. In a top view, the first dam structure 150 may have a shape surrounding the edge of the upper conductive pad 120. According to some example embodiments of the inventive concepts, the first dam structure 150 may have a circular ring shape in a top view. According to other example embodiments of the inventive concepts, the first dam structure 150 may have a polygonal and/or star ring shape such as a triangular, quadrangular, or pentagonal ring shape in a top view.

According to some example embodiments of the inventive concepts, the first dam structure 150 may have a shape corresponding to a shape of the upper conductive pad 120. For example, as shown in FIG. 3, when the upper surface of the upper conductive pad 120 has a circular shape, the first dam structure 150 may have a circular ring shape by extending along the edge of the upper conductive pad 120.

According to other example embodiments of the inventive concepts, the first dam structure 150 may have a different shape from the shape of the upper conductive pad 120. For example, when the upper surface of the upper conductive pad 120 has a circular shape, the first dam structure 150 may have a polygonal ring shape. The first dam structure 150 may partially traverse the edge of the upper conductive pad 120, and thus partially cover a section of the upper conductive pad 120. A section of the upper surface 108 of the interposer substrate 101 may also be exposed in the opening. For example, in the case wherein the first dam structure 150 is a polygonal ring shape and the upper conductive pad 120 is a circular shape, the wall of first dam structure 150 may traverse the edge of the upper conductive pad 120, partially covering the upper conductive pad 120, and/or a portion of the upper surface 108 of the interposer substrate 101 may be exposed at the vertices of the polygonal ring shape.

The first dam structure 150 may include an opening 153 through which at least a part of the upper conductive pad 120 is exposed. For example, the opening 153 may expose part of or all of an upper surface of the upper conductive pad 120. The opening 153 may be a space defined by an inner wall of the first dam structure 150. The opening 153 may be filled with a conductive connector attached to the upper conductive pad 120.

Two or more first dam structures 150, spaced apart from each other, may be on the interposer substrate 101. The each of the two or more first dam structures 150 may extend along edges of different upper conductive pads 120. For example, the two or more first dam structures 150 may surround respective edges of a plurality of upper conductive pads 120 disposed in a matrix pattern on the interposer substrate 101. The matrix pattern may include a generally orthogonal alignment, or may include an off-set stacking alignment.

The first dam structure 150 may block the flow of a molding material and thus prevent inflow of the molding material to the inside of the opening 153 of the first dam structure 150 in a process of manufacturing a semiconductor package including the interposer 100. For example, in a process of manufacturing a semiconductor package including the interposer 100, when a first molding layer (240 of FIG. 5) for molding both the interposer 100 and a first package substrate (210 of FIG. 5) is formed, a part of the molding material may flow along the upper surface 108 of the interposer substrate 101. In this case, the first dam structure 150 may block the molding material flowing along the upper surface 108 of the interposer substrate 101 from flowing into the inside of the opening 153 of the first dam structure 150, thereby preventing the surface of the upper conductive pad 120 exposed by the opening 153 from being partially and/or completely covered by the molding material.

Furthermore, the first dam structure 150 may provide the opening 153 filled with a conductive connector attached to the upper conductive pad 120. While forming the conductive connector through a reflow process for bonding the conductive connector to the upper conductive pad 120, a lower part of the conductive connector may be supported by the first dam structure 150, and thus, the conductive connector may be formed to have a relatively uniform shape and height.

According to some example embodiments of the inventive concepts, the first dam structure 150 may include an insulating material. For example, the first dam structure 150 may include a solder resist, an epoxy-group resin, a polyimide-group resin, and/or the like.

According to some example embodiments of the inventive concepts, the first dam structure 150 may include a conductive material. For example, the first dam structure 150 may include a metal, a conductive polymer, or the like. For example, the first dam structure 150 may include a metal such as copper (Cu), nickel (Ni), cobalt (Co), gold (Au), tungsten (W), and/or an alloy thereof.

According to some example embodiments of the inventive concepts, the first dam structure 150 may include a material having a higher melting point than that of a material forming the conductive connector attached to the upper conductive pad 120. For example, when the conductive connector is formed of a solder (e.g., a soft solder with a melting points between 90° to 450° C. and/or a hard solder with a melting point between 450° C. and 875° C.), the first dam structure 150 may be formed of a metal such as Cu, Ni, and/or Co. When the first dam structure 150 is formed of a material having a higher melting point than the material forming the conductive connector, the first dam structure 150 may not be relatively melted in comparison to the conductive connector in a reflow process for bonding the conductive connector to the upper conductive pad 120, and thus, the conductive connector may be stably supported by the first dam structure 150 during the reflow process.

According to some example embodiments of the inventive concepts, to form the first dam structure 150, a preliminary dam material layer (not illustrated) covering the upper surface 108 of the interposer substrate 101 may be formed, and then a patterning process on the preliminary dam material layer may be performed.

Figure 4:
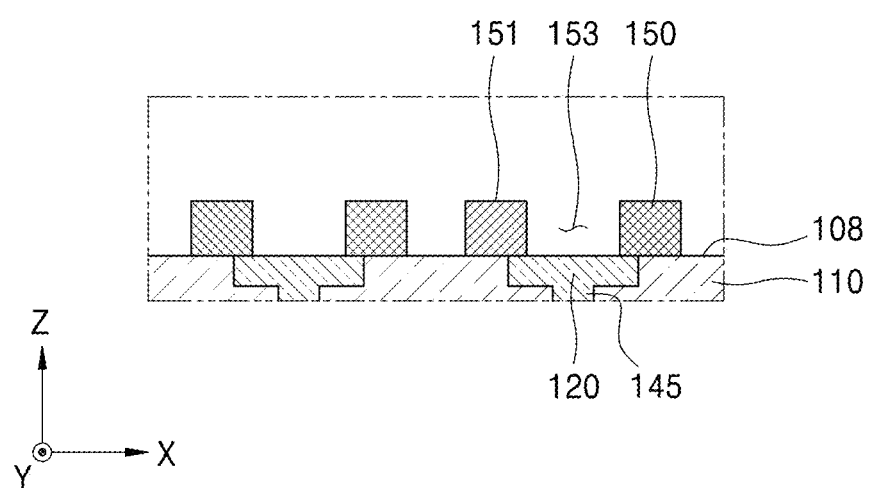
FIG. 4 is a cross-sectional view of a part of an interposer, according to some example embodiments of the inventive concepts.

FIG. 4 is a cross-sectional view of a part of the interposer 100, according to some example embodiments of the inventive concepts. For convenience of description, differences from the interposer 100 described with reference to FIGS. 1 to 3 will be mainly described.

Referring to FIG. 4, the first dam structure 150 may at least partially overlap the upper conductive pad 120 in a vertical direction (a Z direction) and come in contact with the upper conductive pad 120. When the first dam structure 150 is formed of a conductive material, an electrical connection between a conductive connector (e.g., 260 of FIG. 15) and the upper conductive pad 120 may also be achieved through the first dam structure 150 and the upper connection pad 120. Thus, a conductive connection surface area between the conductive connector and the upper conductive pad 120 may include the sidewalls of the first dam structure 150 and the exposed upper surface of the upper conductive pad 120, and may, thus, improve electrical contact between the conductive connector and the upper conductive pad 120.

According to some example embodiments of the inventive concepts, the first dam structure 150 may be formed of the same material as that of the upper conductive pad 120. In this case, during a reflow process for forming the conductive connector, generating an inter-metal compound between the first dam structure 150 and the upper conductive pad 120 may be prevented.

Figure 5:
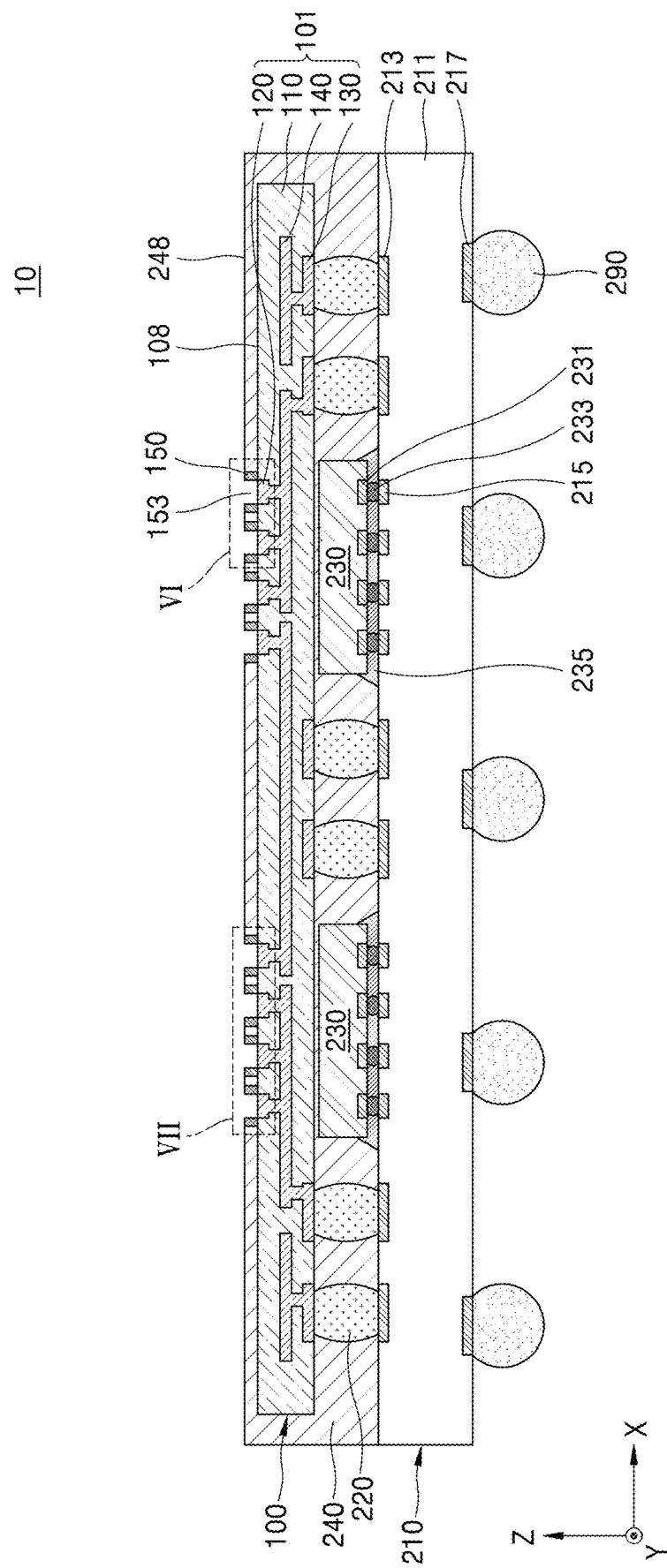
FIG. 5 is a cross-sectional view of a semiconductor package according to some example embodiments of the inventive concepts.
Figure 6:
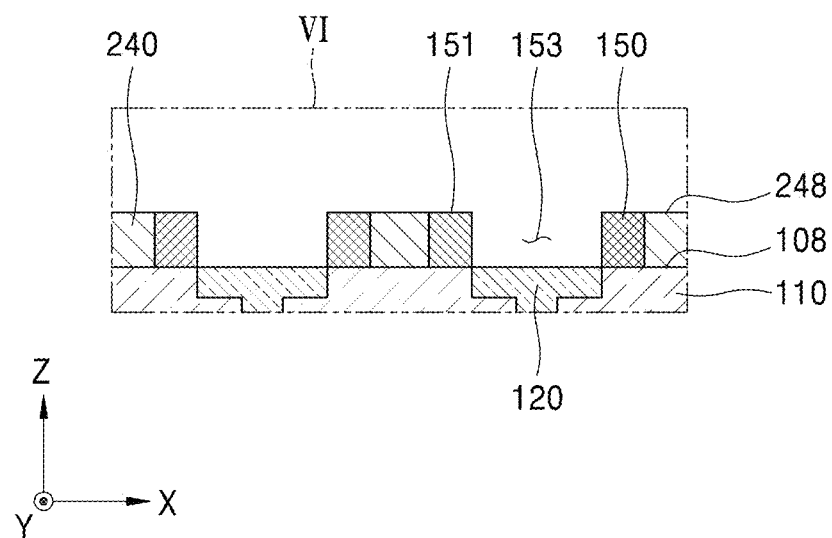
FIG. 6 is an enlarged view of region VI of FIG. 5.
Figure 7:
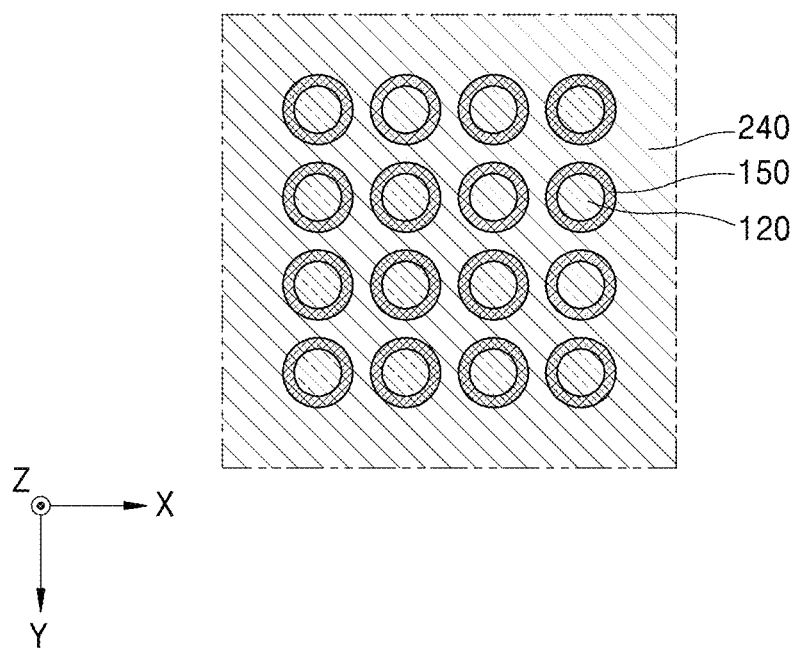
FIG. 7 is a top view of a part of the semiconductor package shown in FIG. 5.

FIG. 5 is a cross-sectional view of a semiconductor package 10 according to some example embodiments of the inventive concepts. FIG. 6 is an enlarged view of region VI of FIG. 5. FIG. 7 is a top view of region VII of the semiconductor package 10 shown in FIG. 5.

Referring to FIGS. 5 to 7, the semiconductor package 10 may include a first package substrate 210, a first semiconductor chip 230, the interposer 100, and a first molding layer 240. For convenience of description, differences from the description with reference to FIGS. 1 to 4 will be mainly described.

The first package substrate 210 may include, for example, a printed circuit board (PCB). The first package substrate 210 may include a substrate base 211 formed of a polymer. For example, the substrate base 211 may include at least one of a phenol resin, an epoxy resin, and/or polyimide. In addition, the first package substrate 210 may include a first upper substrate pad 213 and a second upper substrate pad 215 in an upper surface of the substrate base 211, and a lower substrate pad 217 in a lower surface of the substrate base 211. Internal interconnect layer configured to electrically connect the first upper substrate pad 213, the second upper substrate pad 215, and the lower substrate pad 217 may be formed inside the substrate base 211.

The first upper substrate pad 213, the second upper substrate pad 215, internal interconnect layer, and the lower substrate pad 217 may include a conductive material. For example, the conductive material may be a metal, e.g., Cu, Al, W, Ti, Ta, In, Mo, Mn, Co, Sn, Ni, Mg, Re, Be, Ga, Ru, or an alloy thereof but is not limited thereto.

The first upper substrate pad 213 may be a pad to which a board-interposer conductive connector 220 is attached, and the second upper substrate pad 215 may be a pad to which a chip connection terminal 233 such as a micro-bump is attached. The contact surface area of the second upper substrate pad 215 may be smaller than the contact area of the first upper substrate pad 213. The lower substrate pad 217 may function as a pad to which an external connection terminal 290 is attached. The external connection terminal 290 may be, for example a solder ball. The external connection terminal 290 may electrically connect the semiconductor package 10 to an external device.

The first semiconductor chip 230 may be mounted on the first package substrate 210. The first semiconductor chip 230 may be between the first package substrate 210 and the interposer 100. The first semiconductor chip 230 may include a semiconductor substrate having an active surface and an inactive surface opposite to each other and include a semiconductor device layer on the active surface of the semiconductor substrate. The first semiconductor chip 230 may include a lower surface and an upper surface opposite to each other, and a chip pad 231 may be on the lower surface of the first semiconductor chip 230. For example, the lower surface of the semiconductor chip 230 may include the active surface of the first semiconductor chip 230. The chip pad 231 of the first semiconductor chip 230 may be electrically connected to the semiconductor device layer through an interconnect structure (not shown) inside the first semiconductor chip 230.

The first semiconductor chip 230 may include as a memory chip, a volatile memory chip, and/or a nonvolatile memory chip. The volatile memory chip may include, for example, dynamic random access memory (DRAM), static RAM (SRAM), thyristor RAM (TRAM), zero capacitor RAM (ZRAM), and/or twin transistor RAM (TTRAM). In addition, the nonvolatile memory chip may include, for example, flash memory, magnetic RAM (MRAM), spin-transfer torque MRAM (STT-MRAM), ferroelectric RAM (FRAM), phase change RAM (PRAM), resistive RAM (RRAM), nanotube RRAM, polymer RAM, and/or an insulator resistance change memory.

The first semiconductor chip 230 may be a non-memory chip. For example, the first semiconductor chip 230 may include, for example, an artificial intelligence semiconductor, a microprocessor, a graphic processor, a signal processor, a network processor, a chipset, an audio codec, a video codec, and/or an application processor as a logic chip but is not limited thereto.

The first semiconductor chip 230 may be mounted on the first package substrate 210 by a face-down scheme. That is, the first semiconductor chip 230 may be mounted on the first package substrate 210 such that a surface of the first semiconductor chip 230 on which the chip pad 231 is provided faces the first package substrate 210. The chip pad 231 of the first semiconductor chip 230 may be electrically connected to a second upper substrate pad 215 through a chip connection terminal 233. The chip pad 231 of the first semiconductor chip 230 may be used as a terminal for input/output data signal transmission of the first semiconductor chip 230 or a terminal for power and/or grounding of the first semiconductor chip 230.

An underfill material layer 235 surrounding the chip connection terminal 233 may be filled between the first semiconductor chip 230 and the first package substrate 210. The underfill material layer 235 may be formed of an epoxy resin formed by a capillary underfill method. According to some example embodiments of the inventive concepts, the underfill material layer 235 may be a non-conductive film. However, according to other example embodiments, the first molding layer 240 may directly fill the gap between the first semiconductor chip 230 and the first package substrate 210. In this case, the underfill material layer 235 may be omitted.

The interposer 100 may be stacked on the first package substrate 210. The board-interposer conductive connector 220 may be between the interposer substrate 101 and the first package substrate 210. The board-interposer conductive connector 220 may be, for example, a pillar of a conductive material extending between the lower conductive pad 130 of the interposer substrate 101 and the first upper substrate pad 213 of the first package substrate 210. The board-interposer conductive connector 220 may electrically connect the lower conductive pad 130 of the interposer substrate 101 to the first upper substrate pad 213 of the first package substrate 210.

The first molding layer 240 may be on the first package substrate 210. The first molding layer 240 may be formed to cover at least a part of each of the first package substrate 210, the first semiconductor chip 230, the board-interposer conductive connector 220, and the interposer 100. The first molding layer 240 may protect the first package substrate 210, the first semiconductor chip 230, the board-interposer conductive connector 220, and the interposer 100 from an external environment.

For example, a first part of the first molding layer 240 may be formed to fill in a gap between the interposer 100 and the first package substrate 210, such that the first part of the first molding layer 240 covers a lower surface of the interposer substrate 101, a side surface and an upper surface of the first semiconductor chip 230, and a side surface of the board-interposer conductive connector 220. In addition, a second part of the first molding layer 240 may cover a side surface of the interposer substrate 101. In addition, a third part of the first molding layer 240 may at least partially cover the upper surface 108 of the interposer substrate 101. The third part of the first molding layer 240 may fill the space between the first dam structures 150.

The first molding layer 240 may be formed by a molding process of molding both the first package substrate 210 and the interposer 100. For example, to form the first molding layer 240, an appropriate amount of a molding material may be supplied to the first package substrate 210 and the interposer 100 by an injection process, and the molding material may be hardened by a hardening process. According to example embodiments of the inventive concepts, the molding material forming the first molding layer 240 may include an epoxy-group molding resin, a polyimide-group molding resin, or the like. For example, the first molding layer 240 may include an epoxy molding compound (EMC).

According to some example embodiments of the inventive concepts, a part of the first molding layer 240 may cover the upper surface 108 of the interposer substrate 101 and an outer wall of the first dam structure 150. The first molding layer 240 may be formed on the upper surface 108 of the interposer substrate 101 so as to have a generally uniform thickness. For example, an upper surface 248 of the first molding layer 240 may be generally flat. The thickness of the first molding layer 240 covering the upper surface 108 of the interposer substrate 101 may be equal to or less than a height of the first dam structure 150. For example, a distance between the upper surface 248 of the first molding layer 240 and the upper surface 108 of the interposer substrate 101 in a vertical direction (e.g., the Z direction) may be equal to or less than a distance between the upper surface 151 of the first dam structure 150 and the upper surface 108 of the interposer substrate 101 in the vertical direction.

Figure 8:
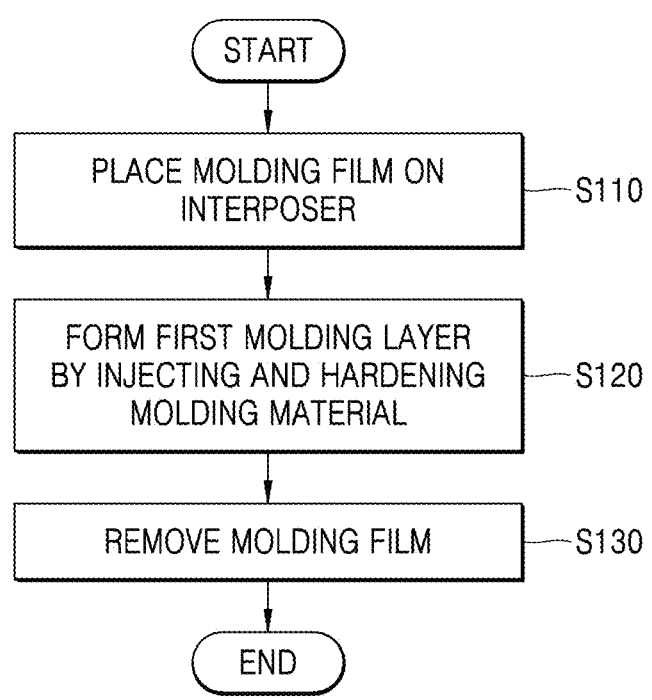
FIG. 8 is a flowchart of a method of forming a first molding layer of the semiconductor package of FIG. 5.

FIG. 8 is a flowchart of a method of forming the first molding layer 240 of the semiconductor package 10 of FIG. 5. FIGS. 9A to 9D are cross-sectional views sequentially showing operations of forming the first molding layer 240 of the semiconductor package 10 of FIG. 5. FIG. 10 is a top view showing flow of a molding material 241 during an operation of forming the first molding layer 240 of the semiconductor package 10. Hereinafter, an example of a method of forming the first molding layer 240 of the semiconductor package 10 will be described with reference to FIGS. 8, 9A to 9D, and 10 together with FIG. 5.

Referring to FIG. 8, to form the first molding layer 240 of the semiconductor package 10, operation S110 of placing a molding film MF on the interposer 100, operation S120 of forming the first molding layer 240 by injecting and hardening the molding material 241, and operation S130 of removing the molding film MF may be sequentially performed.

Figure 9A:
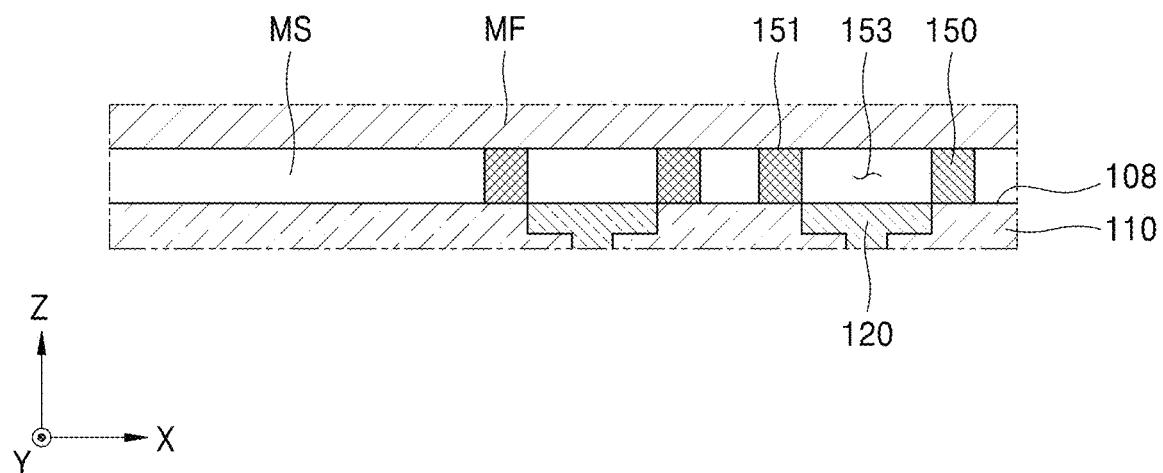
FIGS. 9A to 9D are cross-sectional views sequentially showing operations of forming the first molding layer of the semiconductor package of FIG. 5.
Figure 10:
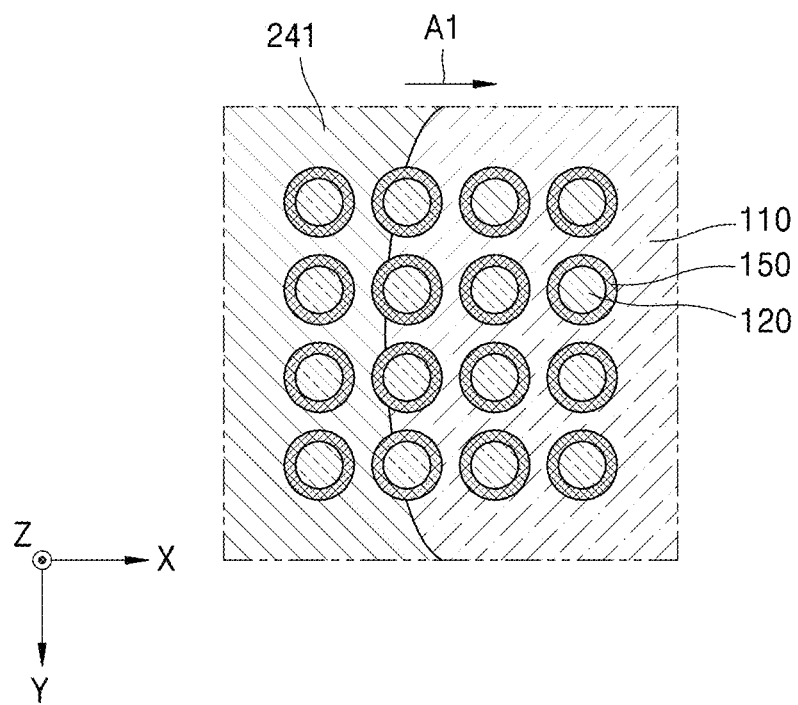
FIG. 10 is a top view showing flow of a molding material during an operation of forming a first molding layer of a semiconductor package.

Referring to FIGS. 8 and 9A, in operation S110 of placing the molding film MF on the interposer 100, the molding film MF may be placed on top the upper surface 151 of the first dam structure 150. The molding film MF may be, for example, a release film and may be provided in a state of being mounted on one side of a molding mold. The molding film MF may be in contact with the upper surface 151 of the first dam structure 150, and appropriate pressure may be applied to the molding film MF so that a gap between the molding film MF and the upper surface 151 of the first dam structure 150 is not generated and without deforming the first dam structure 150. The molding film MF may be apart from the upper surface 108 of the interposer substrate 101 so that a space MS is formed between the upper surface 108 of the interposer substrate 101 and the molding film MF. In this case, a separation distance of the molding film MF from the upper surface 108 of the interposer substrate 101 may be equal to or less than the height of the first dam structure 150. The separation distance of the molding film MF from the upper surface 108 of the interposer substrate 101 may be adjusted by pressure applied to the molding film MF.

Figure 9B:
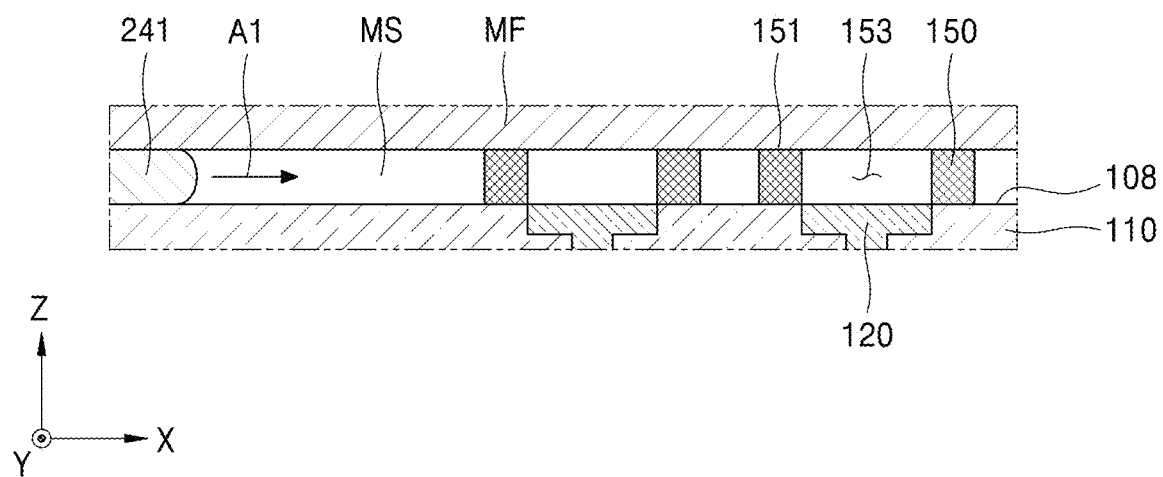

Referring to FIGS. 8, 9B, and 10, in operation S120 of forming the first molding layer 240 by injecting and hardening the molding material 241, the molding material 241 may be supplied from the vicinity of one edge of the interposer substrate 101, and a part of the molding material 241 may be introduced in the space MS between the molding film MF and the upper surface 108 of the interposer substrate 101. On the upper surface 108 of the interposer substrate 101, the molding material 241 may flow in a direction A1 parallel to the plane of the upper surface 108 of the interposer substrate 101 (e.g., an X direction and/or Y direction). In the vicinity of the first dam structures 150, the molding material 241 may flow in a gap between the first dam structures 150, thus encircling the first dam structure 150, but is blocked by the first dam structures 150 so as not to flow inside the openings 153 of the first dam structures 150.

Figure 9C:
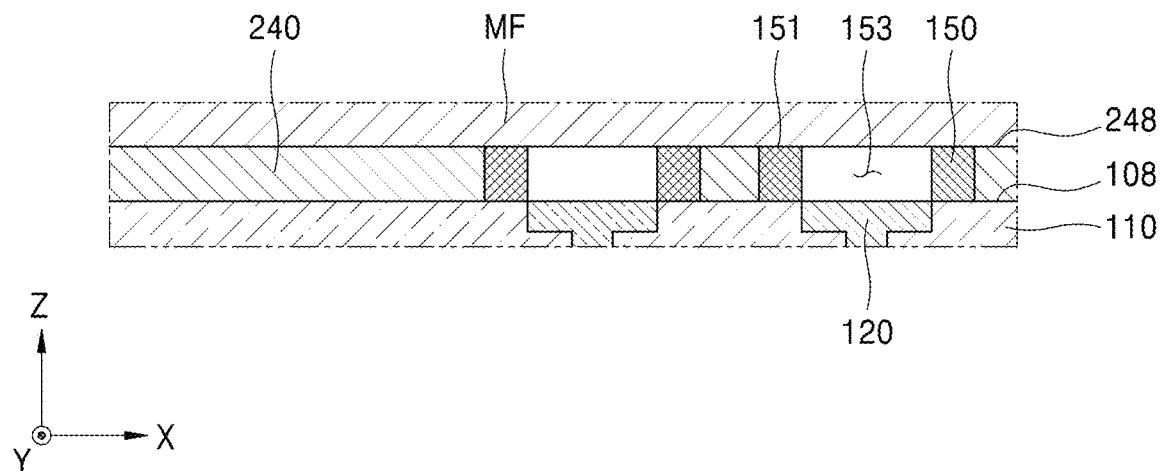

Referring to FIGS. 8 and 9C, in operation S120 of forming the first molding layer 240 by injecting and hardening the molding material 241, when the molding material 241 has sufficiently flowed such that the space MS between the molding film MF and the interposer substrate 101 is filled with the molding material 241, the molding material 241 may be to hardened, thereby forming the first molding layer 240. For example, the molding material 241 may be hardened by subjecting the molding material to hardening conditions like pressure, heat, and/or radiation.

Figure 9D:
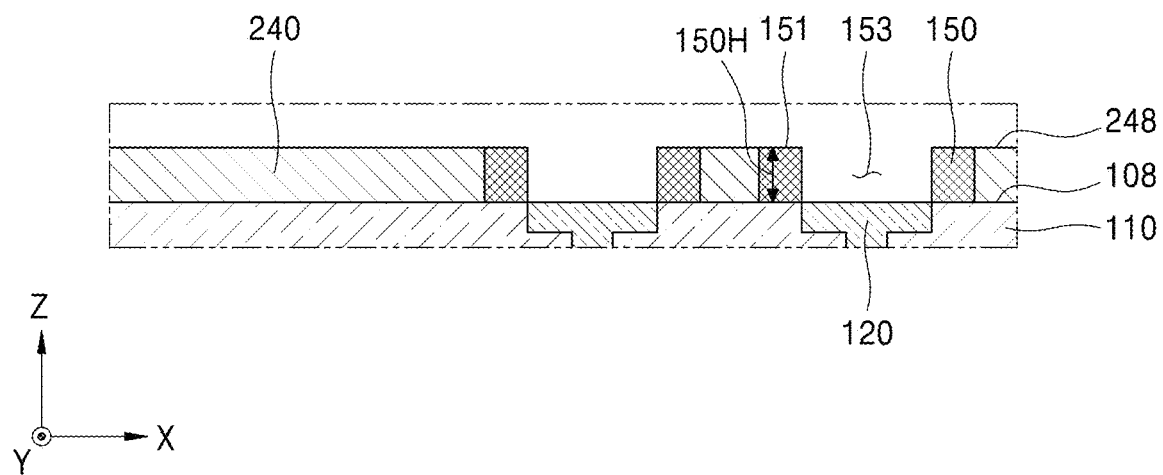

Referring to FIGS. 8 and 9D, after forming the first molding layer 240, the molding film MF (of FIG. 9C) may be removed in operation S130. As a result of removing the molding film MF, the first molding layer 240 may be formed to cover an outer wall of the first dam structure 150, but the upper surface 151 of the first dam structure 150 may be exposed. In addition, the upper conductive pad 120 exposed through the opening 153 of the first dam structure 150 may be exposed.

As a result of removing the molding film MF, the upper surface 248 of the first molding layer 240 and the upper surface 151 of the first dam structure 150 may be exposed. In this case, because the first molding layer 240 is formed to fill the spaced between the molding film MF and the upper surface 108 of the interposer substrate 101, a thickness of the first molding layer 240 covering the upper surface 108 of the interposer substrate 101 may be a height 150H of the first dam structure 150 or less. According to some example embodiments of the inventive concepts, a level of the upper surface 248 of the first molding layer 240 may be the same as a level of the upper surface 151 of the first dam structure 150. For example, the upper surface 248 of the first molding layer 240 may be coplanar with the upper surface 151 of the first dam structure 150. According to some example embodiments of the inventive concepts, the level of the upper surface 248 of the first molding layer 240 may be lower than the level of the upper surface 151 of the first dam structure 150

According to some example embodiments of the inventive concepts, with reference to the upper surface 108 of the interposer substrate 101, the height 150H of the first dam structure 150 may be about 5 micrometers to about 100 micrometers (including boundary values). When the height 150H of the first dam structure 150 is less than 5 micrometers, a thickness of the first molding layer 240 covering the upper surface 108 of the interposer substrate 101 may be too thin to protect the interposer substrate 101 from the first molding layer 240, or a gap between the molding film MF and the interposer substrate 101 may be too small such that the liquidity of the molding material 241 decreases, thereby causing a part of the upper surface 108 of the interposer substrate 101 not to be covered by the first molding layer 240. When the height 150H of the first dam structure 150 is greater than 100 micrometers, a conductive connector (e.g., 260 of FIG. 15) may insufficiently fill in the opening 153 of the first dam structure 150 while forming the conductive connector on the upper conductive pad 120.

Figure 11:
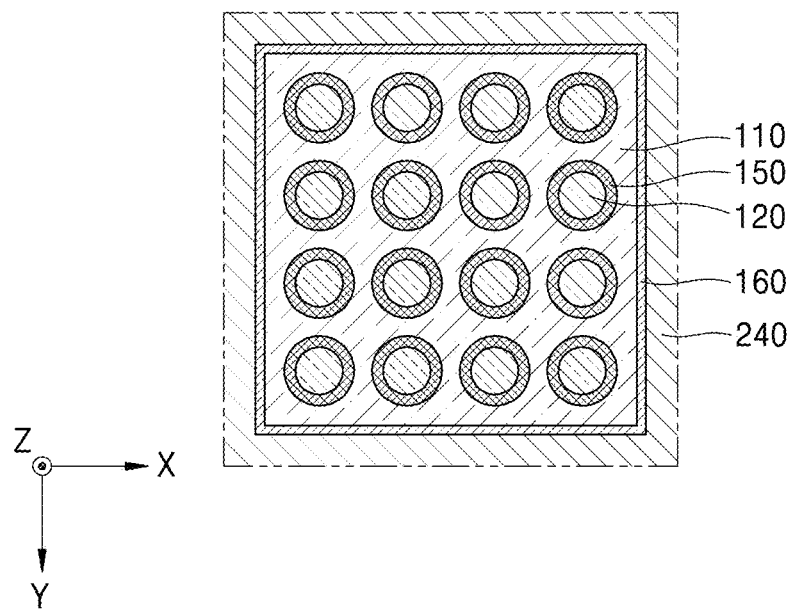
FIG. 11 is a top view of a part of a semiconductor package, according to some example embodiments of the inventive concepts.
Figure 12:
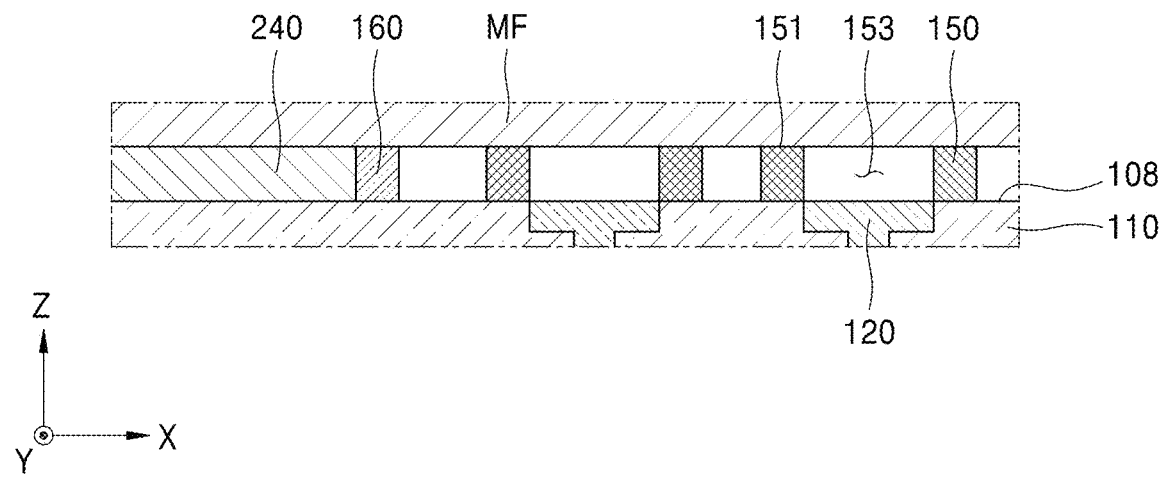
FIG. 12 is a cross-sectional view of the part of the semiconductor package of FIG. 11.

FIG. 11 is a top view of a part of a semiconductor package, according to some example embodiments of the inventive concepts. FIG. 12 is a cross-sectional view of the part of the semiconductor package of FIG. 11. FIG. 12 shows that the molding film MF is attached onto the semiconductor package. For convenience of description, the differences from the semiconductor package 10 described with reference to FIGS. 5 to 7 will be mainly described.

Referring to FIGS. 11 and 12, the interposer 100 may include a second dam structure 160 on the interposer substrate 101. The second dam structure 160 may be apart from the first dam structures 150 and extend on the upper surface 108 of the interposer substrate 101 so as to enclose (e.g. surround) the first dam structures 150.

The second dam structure 160 may have a ring shape continuously extending to enclose two or more first dam structures 150. The second dam structure 160 may provide a space in which the first dam structures 150 are disposed, and the space of the second dam structure 160 may be defined by an inner wall of the second dam structure 160. According to some example embodiments of the inventive concepts, the second dam structure 160 may have a quadrangular ring shape in a top view but is not limited thereto and may have a polygonal ring shape such as a triangular or a pentagonal shape. According to another example embodiment of the inventive concepts, the second dam structure 160 may have a circular ring shape in a top view.

According to some example embodiments of the inventive concepts, the second dam structure 160 may have the same height as the first dam structure 150. In this case, a distance between an upper surface of the second dam structure 160 and the upper surface 108 of the interposer substrate 101 may be the same as the distance between the upper surface 151 of the first dam structure 150 and the upper surface 108 of the interposer substrate 101.

The second dam structure 160 may be configured to primarily block a molding material from flowing toward the first dam structure 150 during a molding process for forming the first molding layer 240. A part of the molding material may flow over the second dam structure 160, but because an amount of the molding material flowing toward the first dam structure 150 is reduced by the second dam structure 160, it may more effectively reduce and/or prevent the molding material from flowing over the first dam structure 150 and on the upper conductive pad 120.

Figure 13:
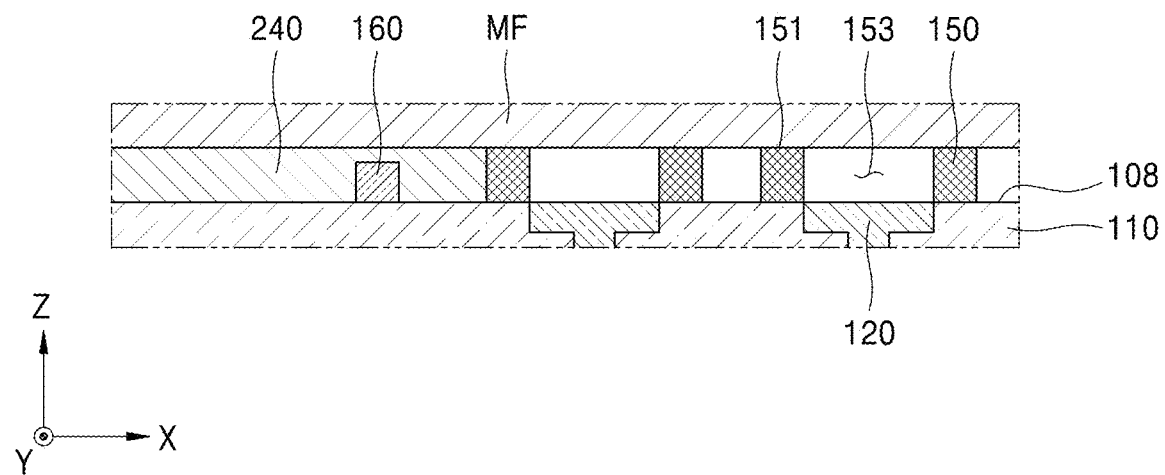
FIG. 13 is a cross-sectional view of a part of a semiconductor package, according to some example embodiments of the inventive concepts.

FIG. 13 is a cross-sectional view of a part of a semiconductor package, according to some example embodiments of the inventive concepts. FIG. 13 shows that the molding film MF is attached onto the semiconductor package. For convenience of description, differences from the semiconductor package described with reference to FIGS. 11 and 12 will be mainly described.

Referring to FIG. 13, a height of the second dam structure 160 may be lower than a height of the first dam structure 150. For example, the distance between an upper surface of the second dam structure 160 and the upper surface 108 of the interposer substrate 101 may be less than the distance between the upper surface 151 of the first dam structure 150 and the upper surface 108 of the interposer substrate 101. In this case, the first molding layer 240 may cover the upper surface of the second dam structure 160 and fill the space between the second dam structure 160 and an outer wall of the first dam structure 150.

Because a gap between the upper surface of the second dam structure 160 and the molding film MF is formed during the molding process for forming the first molding layer 240, the molding material may flow over the second dam structure 160 and toward the first dam structure 150, but because a flow rate of the molding material is reduced by the second dam structure 160, it may more effectively reduce and/or prevent the molding material from flowing over the first dam structure 150 and on the upper conductive pad 120.

Figure 14:
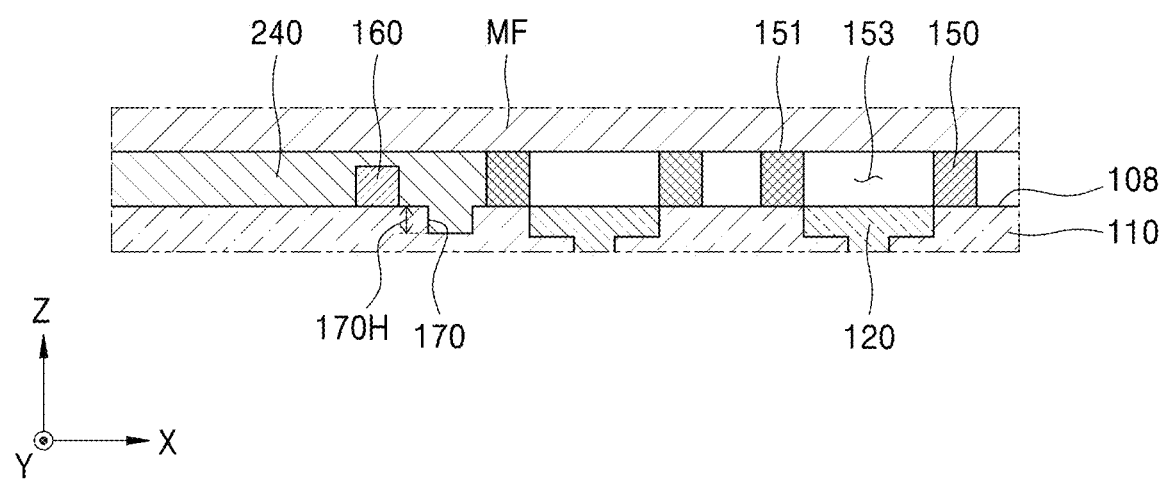
FIG. 14 is a cross-sectional view of a part of a semiconductor package, according to some example embodiments of the inventive concepts.

FIG. 14 is a cross-sectional view of a part of a semiconductor package, according to some example embodiments of the inventive concepts. FIG. 14 shows that the molding film MF is attached onto the semiconductor package. For convenience of description, differences from the semiconductor package described with reference to FIG. 13 will be mainly described.

Referring to FIG. 14, the interposer substrate 101 may include a trench part 170 between the second dam structure 160 and the first dam structure 150. The trench part 170 may be filled with the first molding layer 240. The trench part 170 may be formed by removing a part of the interposer substrate 101. The trench part 170 may have a certain depth 170H from the upper surface 108 of the interposer substrate 101. The depth 170H may be less than the thickness of the interposer substrate base 110 in the vertical direction (e.g., the Z direction). For example, the depth 180H may by less than or equal to the depth of the upper conductive pad 120 in the vertical direction. According to some example embodiments of the inventive concepts, the trench part 170 may extend along an inner wall of the second dam structure 160. According to some example embodiments of the inventive concepts, the trench part 170 may have a ring shape continuously extending along the inner wall of the second dam structure 160 in a top view.

The trench part 170 may be configured to accommodate a molding material having flown over the second dam structure 160. During a molding process for forming the first molding layer 240, the molding material flowing over the second dam structure 160 and toward the first dam structure 150 may fill in the trench part 170.

Figure 15:
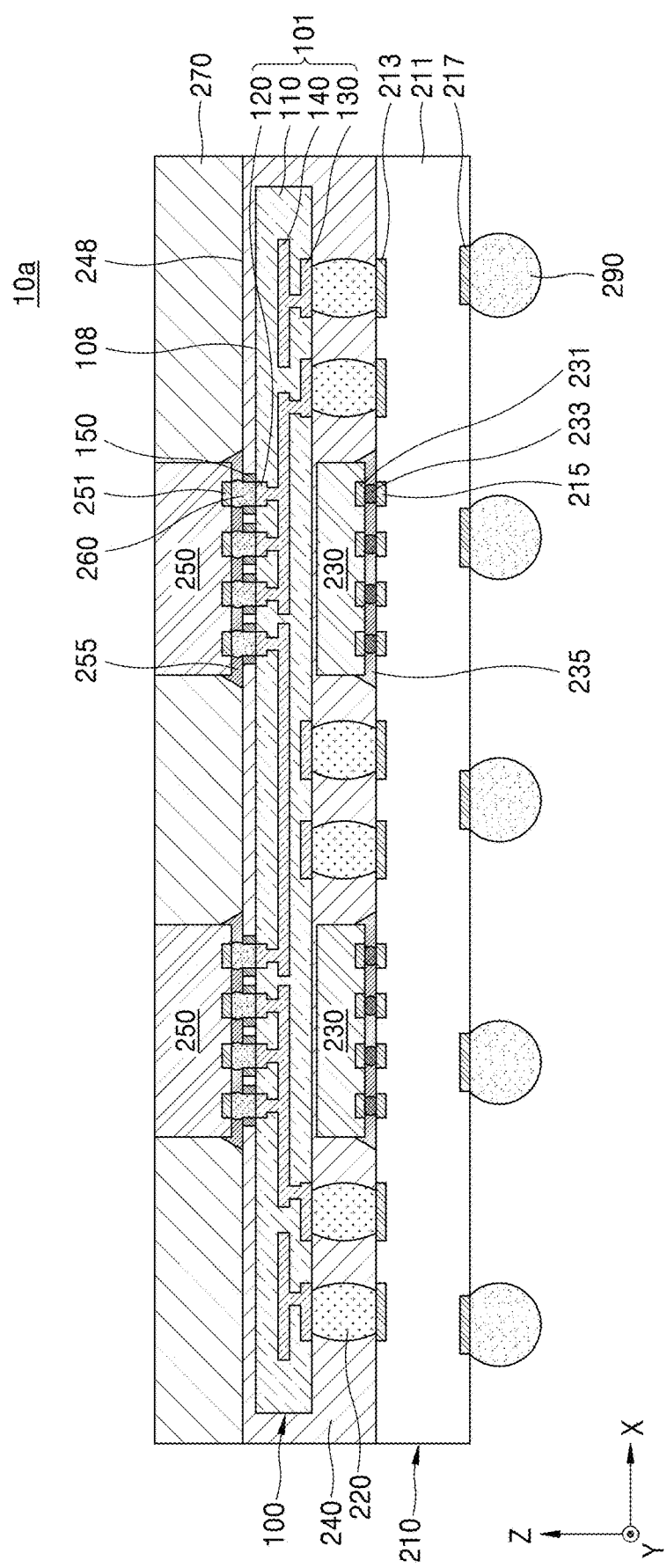
FIG. 15 is a cross-sectional view of a semiconductor package according to some example embodiments of the inventive concepts.

FIG. 15 is a cross-sectional view of a semiconductor package 10a according to some example embodiments of the inventive concepts. For convenience of description, differences from the semiconductor package 10 described with reference to FIGS. 5 to 7 will be mainly described.

Referring to FIG. 15, the semiconductor package 10a may include a second semiconductor chip 250 on the interposer 100, and a second molding layer 270 molding the second semiconductor chip 250.

The second semiconductor chip 250 may be mounted on the interposer 100 by a face-down scheme. For example, the second semiconductor chip 250 may be mounted on the interposer substrate 101 such that one surface of the second semiconductor chip 250 having a chip pad 251 thereon faces the interposer substrate 101. The chip pad 251 of the second semiconductor chip 250 may be connected to a conductive connector 260 attached on the upper conductive pad 120. According to some example embodiments of the inventive concepts, the first semiconductor chip 230 and the second semiconductor chip 250 may be different types of semiconductor chips. For example, the first semiconductor chip 230 may be a memory chip, whereas the second semiconductor chip 250 may be a logic chip. According to some example embodiments of the inventive concepts, the semiconductor package 10a may be a system-in-package operating as a single system with different types of semiconductor chips and components such as other passive devices electrically connected to each other.

An underfill material layer 255 surrounding the conductive connector 260 may be between the second semiconductor chip 250 and the interposer substrate 101. For example, the underfill material layer 255 may include an epoxy resin formed by a capillary underfill method. However, according to another example embodiments of the inventive concepts, the second molding layer 270 may be directly filled in a gap between the second semiconductor chip 250 and the interposer substrate 101. In this case, the underfill material layer 255 may be omitted.

The second molding layer 270 may be on the first molding layer 240. The second molding layer 270 may come in contact with the upper surface 248 of the first molding layer 240 and with at least a part of the surface of the second semiconductor chip 250. According to some example embodiments of the inventive concepts, the second molding layer 270 may cover a side surface of the second semiconductor chip 250 but may not cover an upper surface of the second semiconductor chip 250. Alternatively, according to another example embodiments of the inventive concepts, the second molding layer 270 may cover both the side surface and the upper surface of the second semiconductor chip 250.

According to some example embodiments of the inventive concepts, the second molding layer 270 may include an epoxy-group molding resin, a polyimide-group molding resin, or the like. For example, the second molding layer 270 may include a molding compound. According to some example embodiments of the inventive concepts, the second molding layer 270 may include the same material as the first molding layer 240. According to another example embodiment of the inventive concepts, the second molding layer 270 may include a different material from that of the first molding layer 240.

According to some example embodiments of the inventive concepts, when the second semiconductor chip 250 is mounted on the interposer 100, a reflow process on the conductive connector 260 such as a microbump may be performed to physically and electrically connect the chip pad 251 of the second semiconductor chip 250 to the upper conductive pad 120. When foreign substances such as a molding material remain on the upper conductive pad 120, the connection reliability between the conductive connector 260 and the upper conductive pad 120 may decrease. However, according to some example embodiments of the inventive concepts, because the semiconductor package 10a includes the first dam structure 150 blocking a molding material from flowing toward the upper conductive pad 120 during a molding process, the connection reliability between the conductive connector 260 and the upper conductive pad 120 may increase. Furthermore, while a reflow process on the conductive connector 260 is performed, the first dam structure 150 supports a lower part of the conductive connector 260, and thus, the conductive connector 260 may be formed to have a uniform shape and height.

Figure 16:
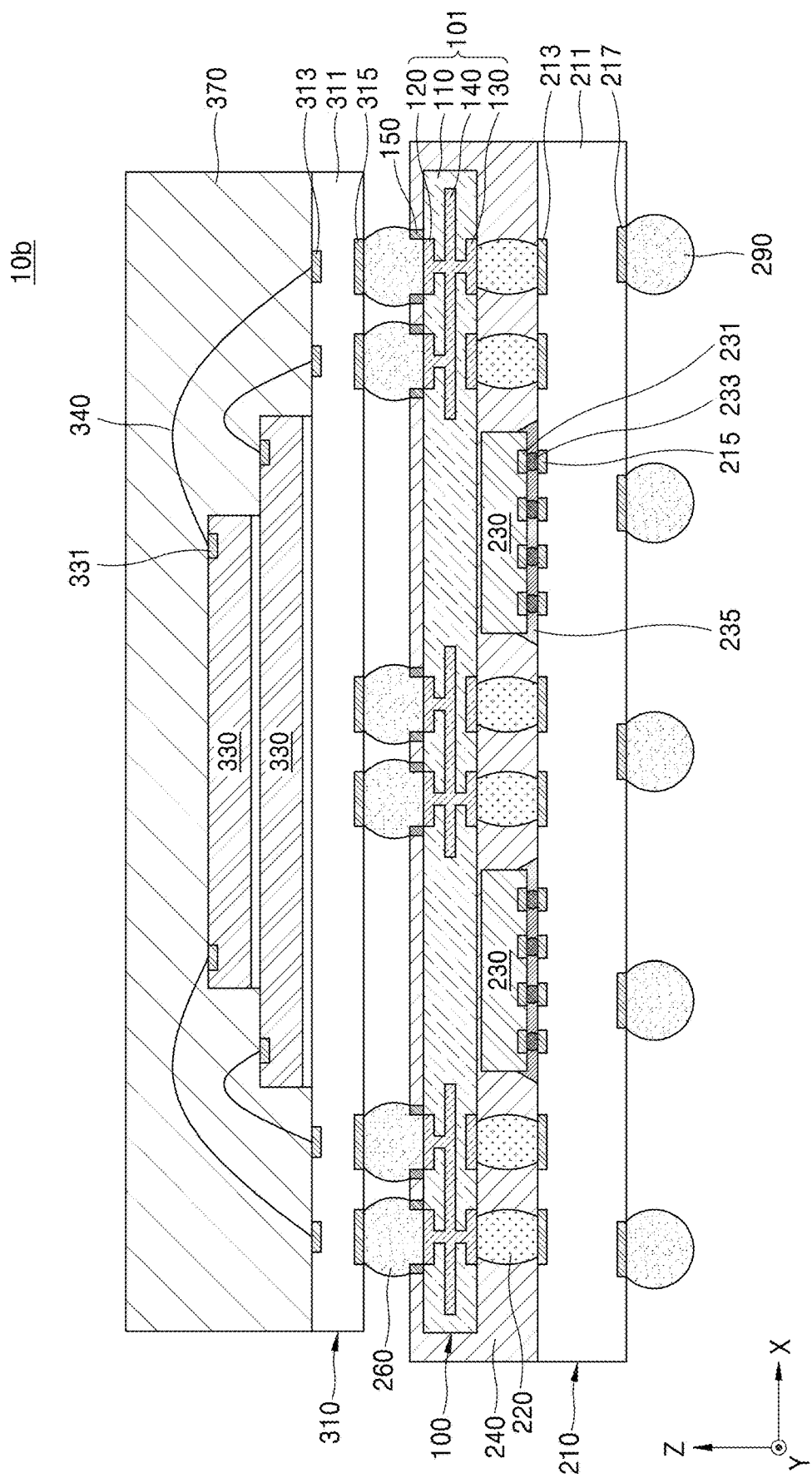
FIG. 16 is a cross-sectional view of a semiconductor package according to some example embodiments of the inventive concepts.

FIG. 16 is a cross-sectional view of a semiconductor package 10b according to some example embodiments of the inventive concepts. For convenience of description, differences from the semiconductor package 10 described with reference to FIGS. 5 to 7 will be mainly described.

Referring to FIG. 16, the semiconductor package 10b may include a second package substrate 310 on the interposer 100, a second semiconductor chip 330 on the second package substrate 310, and a second molding layer 370 molding the second semiconductor chip 330. The semiconductor package 10b may be a package-on-package type semiconductor package in which the first package substrate 210 and the second package substrate 310 are stacked with the interposer 100 therebetween.

The second package substrate 310 may be, for example, a PCB. The second package substrate 310 may include a substrate base 311 formed of at least one material selected from among a phenol resin, an epoxy resin, and polyimide. In addition, the second package substrate 310 may include an upper substrate pad 313 on an upper surface of the substrate base 311 and a lower substrate pad 315 on a lower surface of the substrate base 311. Internal interconnect layers configured to electrically connect the upper substrate pad 313 to the lower substrate pad 315 may be formed inside the substrate base 311.

The second package substrate 310 may be mounted on the interposer through the conductive connector 260. The conductive connector 260 may be between the upper conductive pad 120 on the interposer substrate 101 and the lower substrate pad 315 of the second package substrate 310. The conductive connector 260 may overflow the opening in the first dam structure 150. For example, the conductive connector 250 may cover an upper surface and the inner sidewall of the first dam structure 150. The conductive connector 260 may include, for example, a pillar of conductive material. The conductive material of the conductive connector 260 may be, for example, a metal that wets the first dam structure 150 and/or the upper conductive pad 120 when in a liquid state.

The second semiconductor chip 330 may be on the second package substrate 310. For example, a chip pad 331 of the second semiconductor chip 330 may be electrically connected to the upper substrate pad 313 of the second package substrate 310 through a conductive wire 340. According to some example embodiments of the inventive concepts, the first semiconductor chip 230 and the second semiconductor chip 330 may be different types of semiconductor chips. For example, the first semiconductor chip 230 may be a memory chip, whereas the second semiconductor chip 330 may be a logic chip. According to some example embodiments of the inventive concepts, the semiconductor package 10b may be a system-in-package operating as a single system with different types of semiconductor chips and components such as other passive devices electrically connected to each other.

According to some example embodiments of the inventive concepts, when a package unit including the second package substrate 310, the second semiconductor chip 330, and the second molding layer 270 is mounted on the interposer 100, a reflow process on the conductive connector 260 is performed to physically and electrically connect the second package substrate 310 to the upper conductive pad 120 of the interposer 100. When foreign substances such as a molding material remain on the upper conductive pad 120, the connection reliability between the conductive connector 260 and the upper conductive pad 120 may decrease. However, according to example embodiments of the inventive concepts, because the semiconductor package 10b includes the first dam structure 150 blocking a molding material from flowing toward the upper conductive pad 120 during a molding process, the connection reliability between the conductive connector 260 and the upper conductive pad 120 may increase. Furthermore, while a reflow process on the conductive connector 260 is performed, the first dam structure 150 supports a lower part of the conductive connector 260, and thus, the conductive connector 260 may be formed to have a uniform shape and height.

While the inventive concepts have been particularly shown and described with reference to embodiments thereof, it will be understood that various changes in form and details may be made therein without departing from the spirit and scope of the following claims.

What is claimed is:

1. A semiconductor package comprising:
   a first package substrate;
   a first semiconductor chip on the first package substrate;
   an interposer substrate comprising a lower surface facing the first package substrate, an upper surface opposite to the lower surface, and an upper conductive pad in the upper surface;
   a first dam structure on the upper surface of the interposer substrate and extending along an edge of the upper conductive pad, the first dam structure including an inner wall defining an opening;
   a first molding layer in contact with an outer wall of the first dam structure and including a lower portion extending under the lower surface of the interposer substrate, a middle portion extending along a sidewall of the interposer substrate, and an upper portion contiguous with the middle portion and extending over the upper surface of the interposer substrate; and
   a conductive connector in the opening of the first dam structure such that the conductive connector contacts the upper conductive pad and the inner wall of the first dam structure,
   wherein an upper surface of the conductive connector is higher than at least one of an upper surface of the first dam structure or an upper surface of the first molding layer,
   wherein the first semiconductor chip is provided between the first package substrate and the interposer substrate,
   wherein the first dam structure includes a material different from a material of the first molding layer and a material of the conductive connector, wherein the first dam structure includes an insulating material, and wherein the upper surface of the first molding layer is coplanar with the upper surface of the first dam structure.

2. The semiconductor package of claim 1, wherein the first dam structure has a ring shape continuously extending along the edge of the upper conductive pad.

3. The semiconductor package of claim 1, wherein
the upper conductive pad is one of a plurality of conductive pads,
the first dam structure is one of a plurality of first dam structures spaced apart from each other such that at least a portion the first molding layer is between the plurality of first dam structures, and
wherein each of the first dam structures extends along edges of different upper conductive pads, and
wherein the first molding layer is between the first dam structures.

4. The semiconductor package of claim 1, wherein a height of the first dam structure is 5 micrometers to 100 micrometers.

5. The semiconductor package of claim 1, wherein the first dam structure at least partially overlaps the upper conductive pad in a vertical direction.

6. The semiconductor package of claim 1, further comprising:
a second dam structure on the upper surface of the interposer substrate,
wherein the upper conductive pad is one of a plurality of conductive pads, the first dam structure in one of a plurality of first dam structures, and the plurality of first dam structures are spaced apart from each other, and
wherein each of the first dam structures extends along edges of different upper conductive pads, and
wherein the second dam structure encloses the plurality of first dam structures.

7. The semiconductor package of claim 6, further comprising:
a trench part in the upper surface of the interposer substrate between the plurality of first dam structures and the second dam structure.

8. The semiconductor package of claim 1, further comprising:
a second semiconductor chip connected to the interposer substrate through the conductive connector.

9. The semiconductor package of claim 8, further comprising:
a second molding layer in contact with the second semiconductor chip and the first molding layer.

10. The semiconductor package of claim 1, further comprising:
a second package substrate connected to the interposer substrate through the conductive connector; and
a second semiconductor chip on the second package substrate.

11. A semiconductor package comprising:
a first package substrate;
a first semiconductor chip on the first package substrate;
an interposer substrate comprising a lower surface facing the first package substrate, an upper surface opposite to the lower surface, and a plurality of lower conductive pads in the lower surface and a plurality of upper conductive pads in the upper surface;
first conductive connectors between the plurality of lower conductive pads and the first package substrate;
a plurality of first dam structures on the upper surface of the interposer substrate and having a ring shape continuously extending along an edge of a corresponding upper conductive pad, of the plurality of upper conductive pads, each of the plurality of first dam structures including an inner wall defining an opening; and
a first molding layer in contact with the lower and upper surfaces of the interposer substrate and with outer walls of the plurality of first dam structures, the first molding layer comprising a first portion above the upper surface of the interposer substrate such that the first portion of the first molding layer is between the plurality of first dam structures and has an upper surface planar to or lower than an upper surface of the ring shape of each of the first dam structure,
wherein the first semiconductor chip is provided between the first package substrate and the interposer substrate,
wherein the plurality of first dam structures includes a material different from a material of the first molding layer and a material of the first conductive connectors, and
wherein the first dam structure includes an insulating material.

12. The semiconductor package of claim 11, further comprising:
a second conductive connector in contact with the inner wall of one of the plurality of first dam structures and the corresponding upper conductive pad;
a second semiconductor chip on the interposer substrate and connected to the interposer substrate through the second conductive connector; and
a second molding layer covering a side surface of the second semiconductor chip and contacting the first molding layer.

13. The semiconductor package of claim 11, further comprising:
a second conductive connector in contact with the inner wall of one of the plurality of first dam structures and with the corresponding upper conductive pad;
a second package substrate on the interposer substrate, and connected to the interposer substrate through the second conductive connector; and
a second semiconductor chip on the second package substrate.

14. The semiconductor package of claim 1, wherein the first dam structure includes a solder resist.

15. The semiconductor package of claim 1, the first dam structure physically isolates the upper conductive pad from the first molding layer.

* * * * *